United States Patent [19]
Bylsma et al.

[11] Patent Number: 6,091,756
[45] Date of Patent: Jul. 18, 2000

[54] ANALOG LASER ASSEMBLY

[75] Inventors: Richard Bendicks Bylsma, Allentown; Mindaugas Fernand Dautartas, Alburtis; Carl Edward Gaebe, Fleetwood; Rudolf Feodor Kazarinov, Bethlehem Township, Northampton County; Julie Sheridan-Eng, Upper Macungie Township, Lehigh County; Gleb E. Shtengel, Upper Milford Township, Lehigh County, all of Pa.

[73] Assignee: Lucent Technologies Inc., Murray Hill, N.J.

[21] Appl. No.: 08/996,689

[22] Filed: Dec. 23, 1997

[51] Int. Cl.[7] .................................. H01S 3/08; G02B 6/26
[52] U.S. Cl. ............................................. 372/101; 385/33

[58] Field of Search ................................... 385/31, 33, 34, 385/35, 36, 39, 76, 88; 392/92, 98, 101, 109

[56] References Cited

U.S. PATENT DOCUMENTS

| 5,124,281 | 6/1992 | Ackerman et al. | 437/209 |
| 5,178,319 | 1/1993 | Coucoulas | 228/234 |

*Primary Examiner*—Akm E. Ullah
*Attorney, Agent, or Firm*—Lester H. Birnbaum

[57] ABSTRACT

The invention is a laser assembly for reducing distortion ripple. The assembly includes a spherical lens which has a portion of its surface made optically asymmetric to prevent multiple reflections of scattered light within the lens.

19 Claims, 3 Drawing Sheets

ANALOG LASER ASSEMBLY

FIELD OF THE INVENTION

This invention relates to semiconductor laser assemblies.

BACKGROUND OF THE INVENTION

Analog semiconductor lasers, Such as InP Distributed Feedback (DFB) lasers, are finding increasing use in cable TV transmission systems. In one design, the laser is mounted on the surface of a silicon substrate, and the light from the laser is focused onto an optical fiber by means of a spherical lens which is mounted in a cavity in the silicon substrate. (See, e.g., U.S. Patent Application of Anigbo, Ser. No. 60/00916, filed Dec. 22, 1995, which is incorporated by reference herein.)

One of the problems associated with fabricating such devices is to keep distortion ripple at a minimum. The "distortion ripple" is defined as the variation of the values of the composite second order distortions and the composite triple beat distortions due to reflection feedback as the temperature is changed. Generally, it is desired to keep the distortion ripple at or better than 4 dB over a laser temperature variation of 2 deg C, which is the typical temperature variation of the laser in the package.

SUMMARY OF THE INVENTION

The invention is a laser assembly which includes a semiconductor laser and a spherical lens bonded on a first portion of its surface to a supporting member and positioned with respect to the laser to receive light emitted therefrom at a second portion of the surface of the lens and transmit said light out of the lens at a third portion. The lens includes means on a fourth portion of its surface which is distinct from the first, second, and third portions for producing optical asymmetry at said fourth portion of the lens surface.

BRIEF DESCRIPTION OF THE FIGURES

These and other features of the invention are delineated in detail in the following description. In the drawing.

It will be appreciated that, for purposes of illustration, these figures are not necessarily drawn to scale.

DETAILED DESCRIPTION

Figure 1:
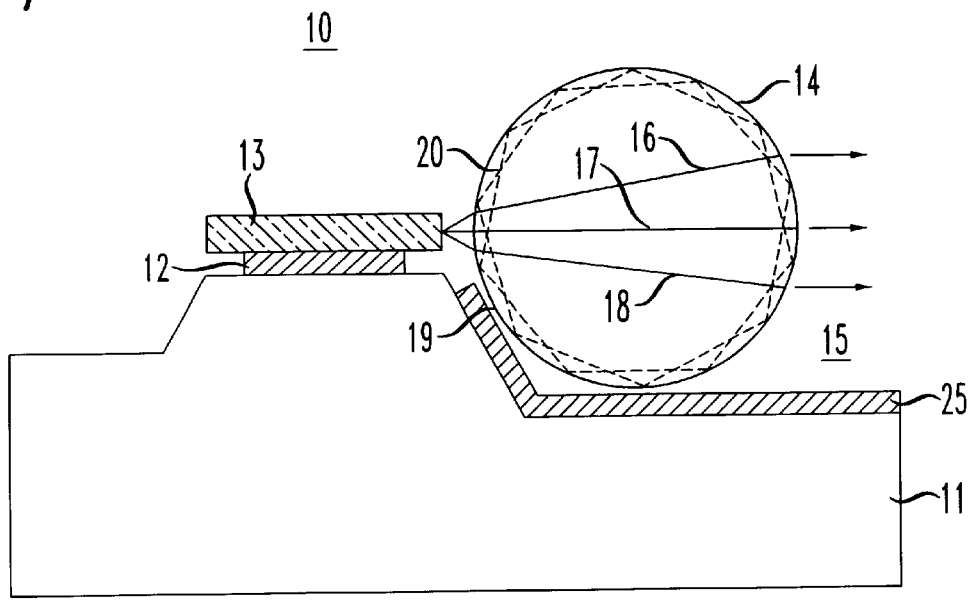
FIG. 1 is a cross sectional view of a portion of a laser assembly in accordance with the prior art illustrating a possible cause of distortion ripple.

FIG. 1 illustrates a portion of an optical assembly, 10, in accordance with the prior art. The assembly includes a substrate, 11, which is typically silicon. A bonding pad, 12, is formed on a major surface of the substrate. The pad is typically Ti/Pt/Au. Mounted on top of the pad, 12, is a semiconductor laser, 13, which in this example is a 1.3 μm InP DFB laser, but could be any semiconductor analog laser. A spherical lens, 14, is mounted in a cavity, 15, etched in the surface of the substrate. The lens is typically made of $M_gAl_2O_3$ or YAG or glass, and is positioned with respect to the laser, 13, to collimate the light from the facing edge of the laser as indicated schematically by the rays 16–18. (For a more detailed discussion of an optical assembly formed on a silicon substrate, see, for example, U.S. Patent Application of Anigbo, cited above.) The lens is bonded to a layer, 20, of aluminum formed on the surfaces of the cavity, 15, according to known techniques to form a three point mechanical contact, one of which is shown as 19, the other two being formed with the side walls of the cavity, 15, which are not shown in this view. (See, for example, U.S. Pat. No. 5,178,319 issued to Coucoulas, which is incorporated by reference herein.)

Applicants have discovered that a source of distortion ripple in such assemblies is scattered light within the lens, 14, as illustrated, for example by the dotted line, 20. Applicants theorize that since the lens is optically symmetrical, the scattered light is multiply reflected within the lens, 14, and gains in intensity due to constructive interference. The scattered light may then exit the lens at a point which interferes with the main beam, 16–18. Alternatively, the scattered light may exit at any point on the lens, 14, but the intensity of such light may be frequency dependent and thereby cause a nonlinearity in the intensity of the main beam at certain optical frequencies.

In accordance with a key feature of the invention, the scattered light, 20, is prevented from being multiply reflected by making the lens optically asymmetrical at some portion of the lens, 14, outside any portion, e.g. 19, which is bonded to the substrate, 11.

Figure 2:
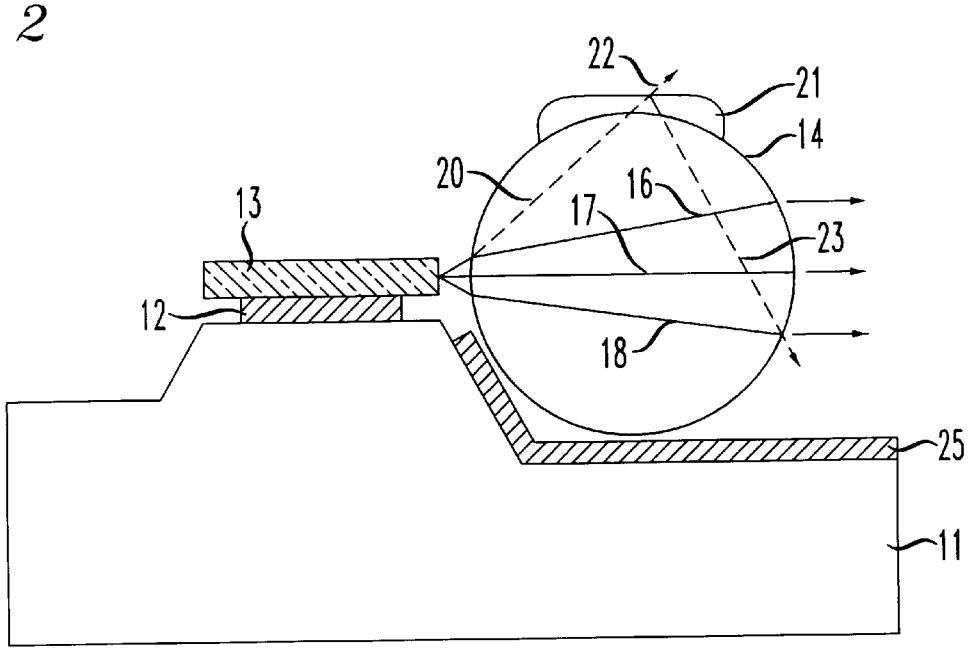
FIG. 2 is a cross sectional view of a portion of a laser assembly in accordance with an embodiment of the invention.

One technique for producing the asymmetry is illustrated in FIG. 2. Here, a top portion of the lens, 14, was coated with a material, 21, which in this example was either a silica-loaded epoxy or black wax. Other materials may be employed, e.g., organic or inorganic adhesives which may be filled or unfilled. The main requirements for the material are that it be not be highly reflective (i.e., has a reflectivity no greater than 60 percent) and that it have an index of refraction greater than the ambient. Preferably, the index of refraction of the material is equal to or greater than that of the lens, 14. Thus, for example non-metallic solders could also be used. The material, 21, was deposited by mechanical transfer, but other techniques could be used. The material had a thickness of approximately 0.01 inches but thicknesses in the range 0.001 to 0.03 inches would be useful.

As illustrated in FIG. 2, the presence of the material, 21, causes the scattered light, 20, to either be refracted out of the lens, 14, at the point of first incidence on the lens surface (ray 22), or, if the scattered light happens to be at less than the critical angle, reflected back into the lens (ray 23). In the latter case, however, the angle of reflection may be such that the scattered light will exit the lens, 14, at the next incidence on the lens surface due to the optical asymmetry produced by the material, 21. In either case, the scattered light, 20, does not have a chance to increase in intensity inside the lens, 14.

Figure 3:
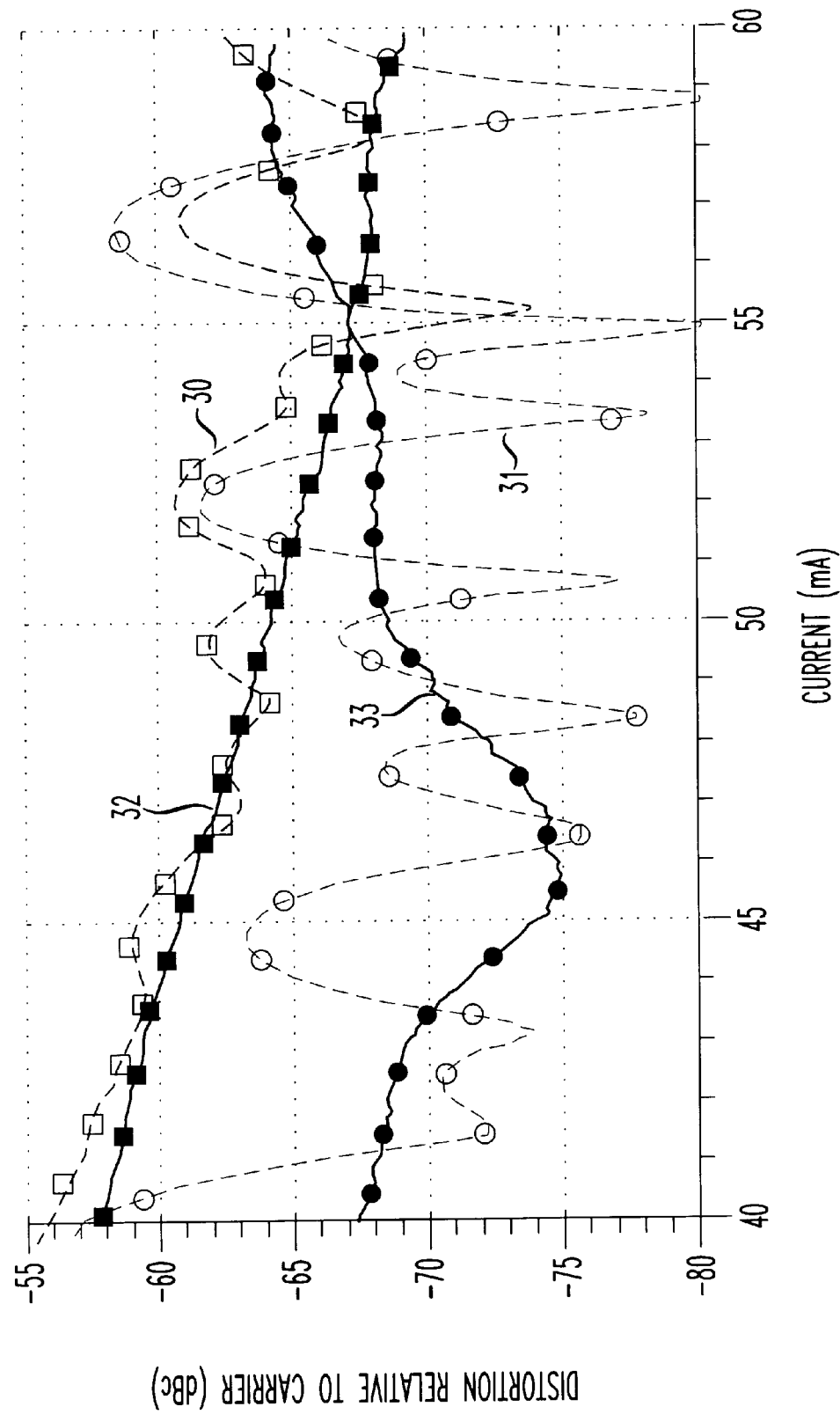
FIGS. 3–4 are graphs of distortion ripple as a function of laser current illustrating advantages of the invention in accordance with the same embodiment.

The dramatic improvement in distortion ripple between the prior art structure of FIG. 1 and the embodiment of FIG. 2 is illustrated in FIG. 3, which is a graph of distortion as a function of dc current supplied to the laser, 13. The dotted line curves, 30 and 31, show the second and third order distortion for different frequencies of modulation of the structure of FIG. 1, and the solid line curves, 32 and 33, show the distortion ripple for the same frequencies of modulation of the device of FIG. 2. Reduction of the distortion ripple from more than 15 dB to approximately 2 dB is achieved. (It will be noted that the distortion minimum at approximately 46 mA is not a ripple feature, but a typical null observed in most DFB lasers.)

Figure 4:
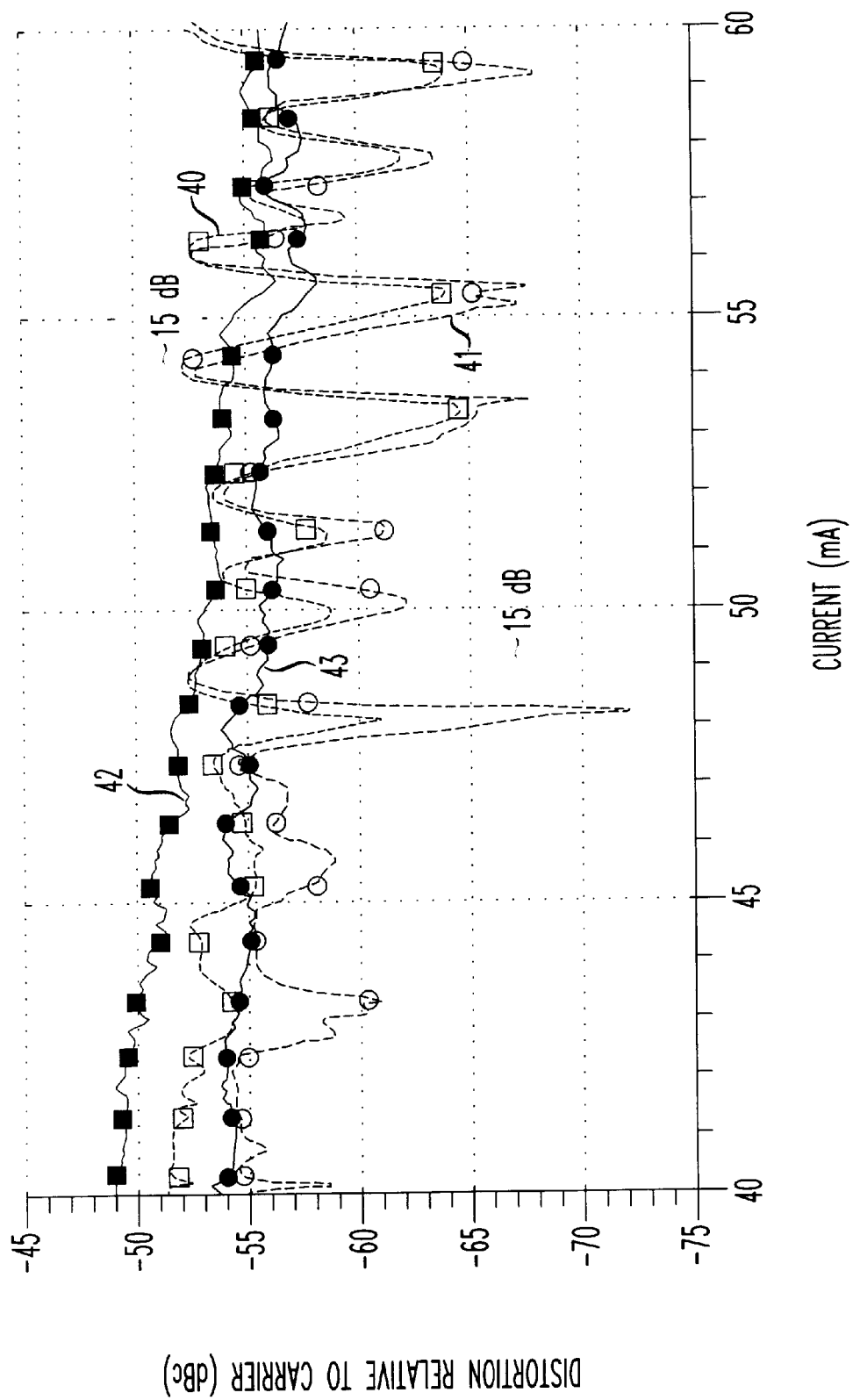

FIG. 4 illustrates distortion ripple improvement for another embodiment of the invention. Here, the prior art device second and third order distortion is represented by curves 40 and 41. Curves 42 and 43 show distortion ripple for an assembly similar to FIG. 2, but with the black wax applied to the bottom of the lens, 14, so that the black wax covered the bottom portion of the lens which was not bonded to the aluminum metallization, 20, i.e., the portion not including site 19 and the two other sites (not shown) where the lens was attached to the sidewalls of the cavity, 15. The black wax was deposited on the bottom surface of the cavity, 15, and heated so that the black wax melted and surface tension drew the black wax under the lens, 14. As shown in FIG. 4, distortion ripple was reduced from approximately 6–15 dB to 1–4 dB.

Various additional modifications will become apparent to those skilled in the art. For example, the optical asymmetry of the lens, 14, can be achieved by mechanically altering the spherical lens by cleaving or grinding a flat on a portion of the surface of the lens outside the path of the main beam.

What is claimed is:

1. An assembly comprising:
   a semiconductor laser;
   a spherical lens bonded on at least a first portion of its surface to a supporting member and positioned with respect to the laser to receive light emitted therefrom at a second portion of its surface and transmit said light out of the lens at a third portion of its surface; and
   means on a fourth portion of the lens surface, which is distinct from the first, second and third portions and any further portions bonded to the supporting member, for producing optical asymmetry at said fourth portion of the lens surface.

2. The assembly according to claim 1 wherein the means for producing asymmetry comprises a material formed on said fourth portion.

3. The assembly according to claim 2 wherein the material is not highly reflective and has an index of refraction greater than the index of refraction of the ambient surrounding the lens.

4. The assembly according to claim 3 wherein the material is an epoxy.

5. The assembly according to claim 3 wherein the material is a non-metallic solder.

6. The assembly according to claim 3 wherein the material is black wax.

7. The assembly according to claim 2 wherein the supporting member is a substrate, and the material is formed on a portion of the lens which is removed from the substrate.

8. The assembly according to claim 2 wherein the supporting member is a substrate and the material is formed on a portion of the lens facing the substrate which is not bonded to the substrate.

9. The assembly according to claim 2 wherein the supporting member is a semiconductor substrate including an aluminum layer formed on a portion of the surface, and the lens is bonded to the aluminum on the first portion.

10. An assembly comprising:
    a semiconductor laser; and
    a spherical lens bonded on at least a first portion of its surface to a supporting member and positioned with respect to the laser to receive light emitted therefrom at a second portion of its surface and transmit said light out of the lens at a third portion of its surface, said lens having an optically asymmetric fourth portion which is distinct from the first, second and third portions and any further portions bonded to the supporting member.

11. The assembly according to claim 10 wherein the asymmetric portion includes a material formed on said portion.

12. The assembly according to claim 11 wherein the material is not highly reflective and has an index of refraction greater than the index of refraction of the ambient surrounding the lens.

13. The assembly according to claim 12 wherein the material is an epoxy.

14. The assembly according to claim 12 wherein the material is a non-metallic solder.

15. The assembly according to claim 11 wherein the supporting member is a substrate, and the material is formed on a portion of the lens which is removed from the substrate.

16. The assembly according to claim 11 wherein the supporting member is a substrate and the material is formed on a portion of the lens facing the substrate which is not bonded to the substrate.

17. The assembly according to claim 11 wherein the supporting member is a semiconductor substrate including an aluminum layer formed on a portion of the surface, and the lens is bonded to the aluminum on the first portion.

18. The assembly according to claim 12 wherein the material is black wax.

19. An assembly comprising:
    a semiconductor laser; and
    a spherical lens bonded on at least a first portion of its surface to an aluminum layer on a semiconductor substrate and positioned with respect to the laser to receive light emitted therefrom at a second portion of its surface and transmit said light out of the lens at a third portion of its surface, said lens having an optically asymmetric fourth portion which is distinct from the second and third portions.

* * * * *